(12) United States Patent
Ruan et al.

(10) Patent No.: US 11,366,170 B2
(45) Date of Patent: Jun. 21, 2022

(54) METHOD AND APPARATUS FOR CORRECTING SOC, BATTERY MANAGEMENT SYSTEM AND STORAGE MEDIUM

(71) Applicant: Contemporary Amperex Technology Co., Limited, Fujian (CN)

(72) Inventors: Jian Ruan, Fujian (CN); Shichao Li, Fujian (CN); Mingshu Du, Fujian (CN); Shenzhi Tang, Fujian (CN); Yanhua Lu, Fujian (CN); Wei Zhang, Fujian (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 69 days.

(21) Appl. No.: 17/076,825

(22) Filed: Oct. 22, 2020

(65) Prior Publication Data

US 2021/0041503 A1 Feb. 11, 2021

Related U.S. Application Data

(63) Continuation of application No. 16/856,638, filed on Apr. 23, 2020, now Pat. No. 10,871,521.

(30) Foreign Application Priority Data

May 24, 2019 (CN) .......................... 201910441422.5

(51) Int. Cl.
*H02J 7/00* (2006.01)
*G01R 31/367* (2019.01)
*G01R 31/392* (2019.01)
*G01R 31/396* (2019.01)
(Continued)

(52) U.S. Cl.
CPC ....... *G01R 31/367* (2019.01); *G01R 31/3648* (2013.01); *G01R 31/3842* (2019.01);
(Continued)

(58) Field of Classification Search
CPC ..................................................... H02J 7/0048
(Continued)

(56) References Cited

U.S. PATENT DOCUMENTS

2011/0208453 A1 8/2011 Song et al.
2012/0143585 A1 6/2012 Barsukov et al.
(Continued)

FOREIGN PATENT DOCUMENTS

CN 108132442 A 6/2018
JP 2011072161 A 4/2011
(Continued)

OTHER PUBLICATIONS

The First Office Action for Japan Application No. 2020-048767, dated Apr. 20, 2021, 4 pages.
(Continued)

*Primary Examiner* — Edward Tso
*Assistant Examiner* — Ahmed H Omar
(74) *Attorney, Agent, or Firm* — Law Offices of Liaoteng Wang (57) ABSTRACT

A method and apparatus for correcting a state of charge (SOC) is provided. The method includes: acquiring state data of a battery cell in a case where the battery cell meets a preset standing condition, wherein the state data includes: current and voltage data, the preset standing condition is that the current in the state data is less than a preset current threshold, wherein a length of the voltage data in the state data is greater than a preset length; calculating an estimated steady-state Open Circuit Voltage (OCV) value according to the state data, under a condition that a change value of the voltage data in the state data is greater than a preset change threshold; determining a SOC correction value corresponding to the estimated steady-state OCV value; and correcting
(Continued)

a current SOC by using the SOC correction value corresponding to the estimated steady-state OCV value.

18 Claims, 7 Drawing Sheets

(51) Int. Cl.
  *G01R 31/3842* (2019.01)
  *G01R 31/36* (2020.01)
(52) U.S. Cl.
  CPC ......... *G01R 31/392* (2019.01); *G01R 31/396* (2019.01); *H02J 7/0048* (2020.01)
(58) Field of Classification Search
  USPC .......................................... 320/132
  See application file for complete search history.

(56) References Cited

U.S. PATENT DOCUMENTS

| | | | | |
|---|---|---|---|---|
| 2013/0275067 | A1* | 10/2013 | Mikuteit | G06F 17/00 702/63 |
| 2015/0301121 | A1* | 10/2015 | Park | G01R 31/392 324/426 |
| 2018/0321324 | A1 | 11/2018 | Karippumannil et al. | |
| 2018/0328998 | A1* | 11/2018 | Zhang | G01R 31/3842 |
| 2019/0036356 | A1* | 1/2019 | Subbaraman | G01R 31/392 |
| 2019/0308630 | A1* | 10/2019 | K | B60W 50/14 |

FOREIGN PATENT DOCUMENTS

| | | |
|---|---|---|
| JP | 2017016991 A | 1/2017 |
| KR | 1020120082965 A | 7/2012 |

OTHER PUBLICATIONS

The First Office Action for Korea Application No. 10-2020-7034112, dated Feb. 23, 2021, 19 pages.
The Second Office Action for China Application No. 201910441422.5, dated Dec. 8, 2020, 12 pages.
The First Office Action for Europe Application No. 20171750.1, dated May 6, 2021, 9 pages.
The First Office Action for Indian Application no. 202027046655, dated Jan. 3, 2022, 6 pages.

\* cited by examiner

METHOD AND APPARATUS FOR CORRECTING SOC, BATTERY MANAGEMENT SYSTEM AND STORAGE MEDIUM

CROSS-REFERENCE TO RELATED APPLICATION

The present application is a continuation of U.S. patent application Ser. No. 16/856,638, filed on Apr. 23, 2020, which claims priority to Chinese Patent Application No. 201910441422.5, filed on May 24, 2019. The afore-mentioned patent applications are incorporated herein by reference in their entireties.

TECHNICAL FIELD

The present invention relates to the field of battery technologies, and in particular, to a method and an apparatus for correcting State of Charge (SOC), a battery management system, and a storage medium.

BACKGROUND

The SOC represents a ratio of a remaining capacity of a battery with respect to a capacity of the battery in fully charged state, where the remaining capacity of the battery refers to a capacity remained after the battery is used for a period of time or laid aside for a long time. When SOC=0, it indicates that the battery is completely discharged, and when SOC=1, it indicates that the battery is fully charged. SOC estimation is one of the most important functions of a battery management system, and used to enable power indication, remaining mileage presentation, over-charge and over-discharge protection, battery balancing, charge control and battery health prediction of the battery management system.

Conventionally, the SOC estimation is mainly performed by using an open circuit voltage method. Specifically, a corresponding between open circuit voltages (OCVs) in steady states of a battery cell and SOCs is used to obtain SOC of the battery in a steady state (i.e., steady-state SOC).

However, acquisition of a steady-state OCV usually requires a battery cell to be let stand still for a long time (more than a few hours), but in an actual use situation, there is little chance to let a battery cell stand still for a long time, so there is little chance to get a steady-state OCV of the battery cell, reducing applicability of the open circuit voltage method.

SUMMARY

The embodiments of the disclosure provides a method and an apparatus for correcting SOC, a battery management system and a storage medium, with which a steady-state OCV of a battery cell can be quickly estimated by using characteristics of an external circuit during a short standing time period of the battery, and applicability of an open circuit voltage method can be improved.

In a first aspect, an embodiment of the disclosure provides a method for correcting SOC, including: acquiring state data of a battery cell in a case where the battery cell meets a preset standing condition; determining, when a length of voltage data in the state data of the battery cell is greater than a first preset length and less than a second preset length, and a change value of the voltage data in the state data of the battery cell is greater than a preset change threshold, a first set of pending parameters of a predetermined near-steady-state battery model according to the state data of the battery cell; predicting a second set of pending parameters of the predetermined near-steady-state battery model according to the first set of pending parameters; calculating an estimated steady-state OCV value according to the second set of pending parameters; and determining a SOC correction value corresponding to the estimated steady-state OCV value by using a preset correspondence between steady-state OCVs and SOCs to correct a current SOC.

In a second aspect, an embodiment of the disclosure provides an apparatus for correcting SOC, including: a data acquisition module configured to acquire state data of a battery cell in a case where the battery cell meets a preset standing condition; a first set of parameters determination module configured to determine, when a length of voltage data in the state data of the battery cell is greater than a first preset length and less than a second preset length, and a change value of the voltage data in the state data of the battery cell is greater than a preset change threshold, a first set of pending parameters of a predetermined near-steady-state battery model according to the state data of the battery cell; a second set of pending parameter prediction module configured to predict a second set of pending parameters of the predetermined near-steady-state battery model according to the first set of pending parameters; and a SOC correction module configured to calculate an estimated steady-state OCV value according to the second set of pending parameters, and determine a SOC correction value corresponding to the estimated steady-state OCV value by using a preset correspondence between steady-state OCVs and SOCs to correct a current SOC.

In a third aspect, an embodiment of the disclosure provides a battery management system, including the apparatus for correcting the SOC according as described above.

In a fourth aspect, an embodiment of the disclosure provides a storage medium having a program stored thereon, wherein the program is executed by a processor to implement the method for correcting the SOC as described above.

In order to avoid a problem that acquisition of a steady-state OCV requires a battery to be let stand still for a long time during SOC estimation, the embodiments of the disclosure firstly determines pending parameters of a near-steady-state battery model according to state data of a battery cell in a case where the battery cell meets a preset standing condition to characterize variation trend of OVC over time in a near-steady state, then use the pending parameters to process a steady-state time period threshold to obtain an estimated steady-state OCV value, and then use a preset correspondence between steady-state OCVs and SOCs to determine a SOC correspond to the estimated steady-state OCV to correct a current SOC.

Compared with the conventional open circuit voltage method, it is possible for the embodiments of the present invention to determine a first set of pending parameters of a near-steady-state battery model for characterizing a change in an open circuit voltage over time in a near-steady state by using characteristics of an external circuit during a short standing time period of the battery and use the first set of pending parameters to estimate a steady-state OCV, reducing time required to obtain a steady-state OCV and in turn increasing a chance of correction of SOC so that applicability of an open circuit voltage method can be improved.

In addition, in the embodiments of the present invention, the condition of the state data of the battery cell used in determination of the near-steady-state battery model is further limited from the viewpoint of whether the voltage data amount is sufficient and whether the change value of the voltage data is credible. For example, in order to solve a problem that the length of the voltage data is insufficient, it is possible for the embodiments of the present invention to predict a second set of pending parameters of the predetermined near-steady-state battery model for the second preset length according to the first set of pending parameters, and then use the first set of pending parameters to estimate the steady-state OCV, thereby avoiding inaccuracy of the pending parameters of the preset near-steady-state battery model due to insufficient state data of the battery cell, and further improving estimation accuracy and applicability of the open circuit voltage method.

BRIEF DESCRIPTION OF THE DRAWINGS

The disclosure may be better understood from the following description of embodiments of the disclosure. In the accompanying drawings, the same or like reference signs denotes the same or like features.

DETAILED DESCRIPTION

Features and exemplary embodiments of various aspects of the disclosure are described in detail below. In the following detailed description, numerous specific details are set forth in order to provide complete understanding of the disclosure.

The embodiments of the present invention provides a method and an apparatus for correcting SOC, a battery management system and a storage medium. With the technical solution in the embodiments of the disclosure, it is possible to determine a model when an open circuit voltage of a battery become steady and estimate the open circuit voltage in the steady state by using characteristics of an external circuit during a short standing time period of the battery to reduce time required for acquisition of an open circuit voltage in the steady state, thereby solving a problem that acquisition of a steady-state open circuit voltage requires a long time, and increasing a chance of correction of SOC so that applicability of an open circuit voltage method can be improved.

The following briefly describes several concepts involved in the embodiments of the disclosure.

Open Circuit Voltage (OCV) refers to a terminal voltage when a battery cell is in an open state or when an external current is near zero.

Steady-State OCV refers to a terminal voltage when a voltage change rate is less than a preset threshold in the case where the battery cell is in an open state or an external current is near zero for a long time.

Unsteady-State OCV refers to an estimated open circuit voltage added with a polarization voltage compensation value in the case where the battery cell is in an open state or an external current is near zero for a short time.

Near-Steady-State OCV refers to a voltage during reaching the steady-state OCV in the case where the battery cell is in an open state or the current is near zero after a period of current excitation.

Figure 1:
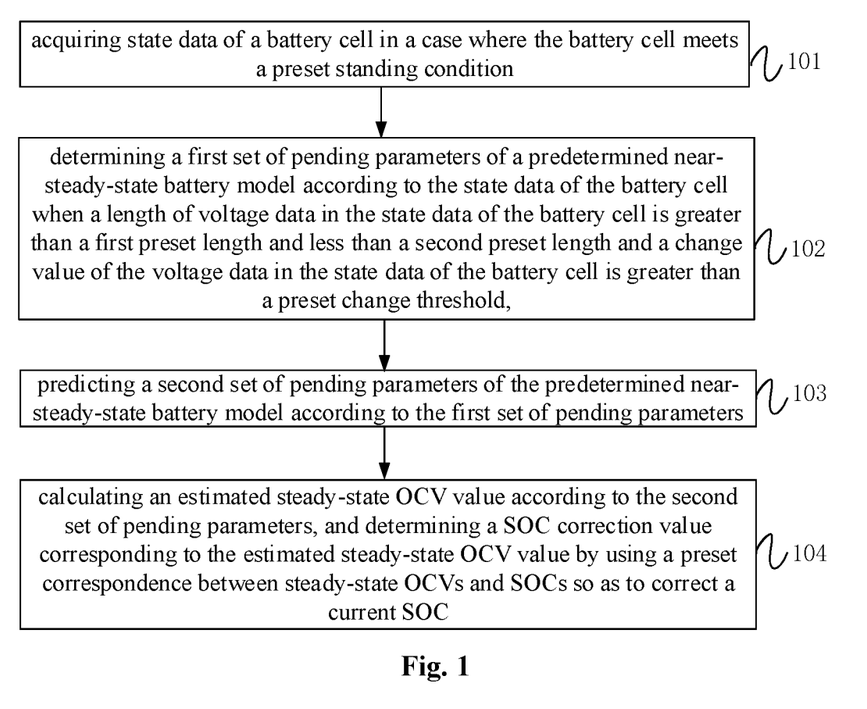
FIG. 1 is a schematic flowchart of a method for correcting SOC according to a first embodiment of the disclosure.

FIG. 1 is a schematic flowchart diagram of a method for correcting SOC according to an embodiment of the disclosure. As shown in FIG. 1, the method for correcting SOC includes steps 101 to 104.

In step 101, state data of a battery cell in a case where the battery cell meets a preset standing condition is acquired.

The state data of the battery cell may include: State of Health (SOH). SOH is a percentage of a full capacity of a battery relative to a rated capacity of the battery, and is used to indicate ability of the battery to store charge. The SOH of a new battery from a factory is 100%, and will decrease over time. The value of SOH in a short time period can be considered unchanged.

In an example, the state data of the battery cell may further include: voltage, current, temperature, and the like.

In an example, the preset standing condition may indicate that a current of the battery cell is less than a preset current threshold.

The preset current threshold may be determined by looking up a correspondence between a preset correspondence between SOCs, temperatures and preset current thresholds based SOC and temperature of the battery cell at current time.

In an specific implementation, when the battery cell meets the preset standing condition, SOH of the battery cell, a voltage sequence UList=[V1, V2, . . . Vn], a current sequence IList=[I1, I2, . . . , In], a temperature sequence TList=[T1, T2, . . . Tn] and a time sequence TimeList=[t1, t2, . . . , tn] can be recorded, and a time period Te in the case where the standing condition is met is accumulated.

Figure 2:
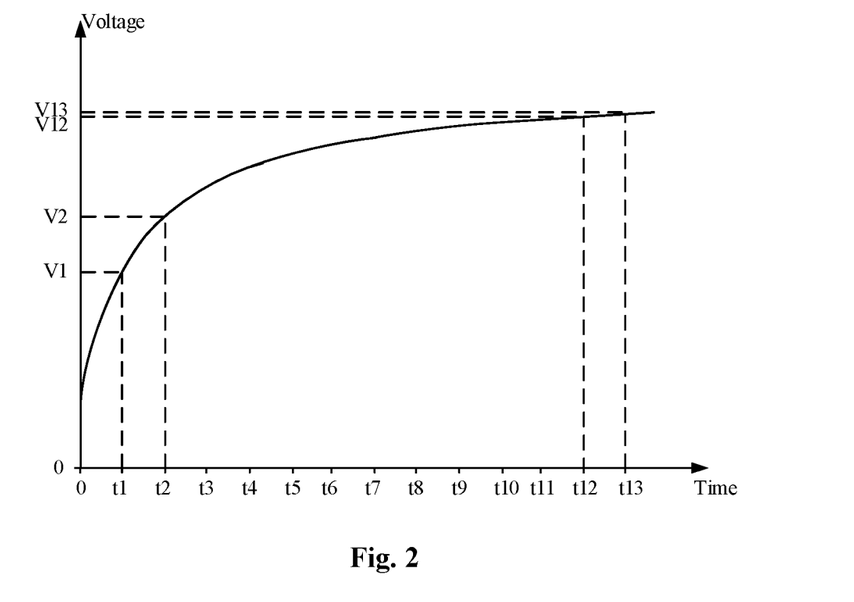
FIG. 2 is a schematic graph of voltages over time based on a time sequence and a corresponding voltage sequence according to an embodiment of the disclosure.

FIG. 2 is a schematic graph of voltages over time based on a time sequence and a corresponding voltage sequence according to an embodiment of the disclosure.

In FIG. 2, the horizontal ordinate indicates time, the longitudinal coordinates indicate voltage. The voltage at time t1 is V1, the voltage at time t2 is V2, the voltage at time t12 is V12, and the voltage at time t13 is V13.

In an example, the near-steady-state battery model can be utilized to characterize variation curves in FIG. 2.

Four near-steady-state battery models are given below, where V(t) is a voltage of the battery as a function of time during the near-steady-state state:

Model M1:

$$V(t)=a_1-b_1 t^{c'_1} e^{c_1/t} \log_e^{d_1}(t) \quad (1)$$

where $a_1$, $b_1$, $c_1$, $c'_1$, $d_1$ are specific parameters of model M1, and e is a natural base.

Model M2:

$$V(t)=a_1-b_1 t^{c'_1} e^{c_1/t} \log_e^{d_1}(t) \quad (2)$$

where $a_1$, $b_1$, $c_1$, $d_1$ are specific parameters of model M2, and e is a natural base.

Model M3:

$$V(t)=a_1+b_1t^{-1}+b_2t^{-2}+\ldots+b_nt^{-n}+c_1e^{-d_1t}+\ldots+c_ne^{-d_nt} \quad (3)$$

where $a_1, b_1, \ldots, b_n, c_1, \ldots c_n, d_1, \ldots d_n$ are specific parameters of model M3, and e is a natural base.

Model M4:

$$V(t)=a_3-b_3e^{c_3t} \quad (4)$$

where $a_3, b_3, c_3$ are specific model parameters, and e is a natural base.

It should be noted that the near-steady-state battery model according to the embodiments of the disclosure is not limited to the above four types, and includes simplification and deformation of respective models, which are not limited herein.

Figure 3:
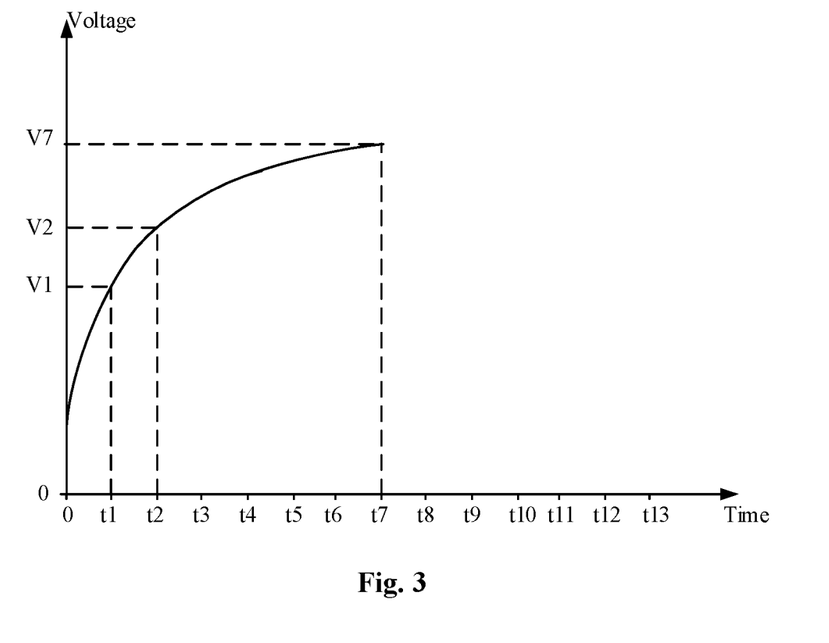
FIG. 3 is a schematic graph of voltages over time based on a time sequence and a corresponding voltage sequence according to another embodiment of the disclosure.

FIG. 3 is a schematic graph of voltages over time based on a time sequence and a corresponding voltage sequence according to another embodiment of the disclosure.

FIG. 3 is different from FIG. 2 in that FIG. 3 shows a curve of voltage over time based on a voltage sequence from time t1-t7. As for the data in FIG. 2, there may be a problem that an amount of data is insufficient or the standing time period is short. Therefore, based on the voltage sequence from time t1-t7, it is impossible to accurately reflect a change of the voltage over time after the time t7, thereby reducing accuracy of the pending parameters of the preset near-steady-state battery model.

In view of this point, the embodiments of the disclosure utilize a length of the voltage data to represent the number of collected voltage data, i.e. the amount of the voltage data used in calculation, and to reflect a length of the standing time period.

In the embodiments of the disclosure, in order to describe whether the amount of voltage data is sufficient, three intervals may be divided according to the length of the voltage data:

$1^{st}$ length interval: 0 to a first preset length. When the length of the collected voltage data is within the first length interval, it indicates that the data amount is too less and the standing time period is too short. At this time, the current SOC is not corrected;

$2^{nd}$ length interval: the first preset length to a second preset length. When the length of the collected voltage data is within the second length interval, it indicated that the data volume is not sufficient and the standing time period is not long enough. At this time, the steady-state OCV may be directly estimated with decreased accuracy.

$3^{rd}$ length interval: the second preset length to +∞. If the length of the collected voltage data is within the third length interval, it indicates that the data volume is sufficient and the standing time period is also long enough. At this time, the steady-state OCV may be directly estimated with high accuracy.

Further, in order to describe whether the voltage data is trustable or not, it is necessary to confirm a change value of the voltage data in the state data of the battery cell.

If the change value of the voltage data is greater than a preset change threshold, it indicates that change trend of the voltage over time curve in FIG. 2 or FIG. 3 is obvious, and the steady-state OCV may be directly estimated with high accuracy.

If the change value of the voltage data is not greater than the preset change threshold, it indicates that change trend of the voltage over time curve in FIG. 2 or FIG. 3 is not obvious, and the steady-state OCV may be directly estimated with decreased accuracy.

The first preset length and the second preset length may be determined by a current of the battery cell. If the current of the battery cell is small, a change in voltage slope is small, and the first preset length and the second preset length may be appropriately reduced. If the current of the battery cell is big, a change in voltage slope is big, and the first preset length and the second preset length must be appropriately increased so as to ensure sufficient data and in turn ensure accuracy of the pending parameters of the preset near-steady-state battery model.

Regarding the second length interval, steps 102-104 may be performed.

In step 102, when a length of voltage data in the state data of the battery cell is greater than a first preset length and less than a second preset length and a change value of the voltage data in the state data of the battery cell is greater than a preset change threshold, a first set of pending parameters of a preset near-steady-state battery model are determined according to the state data of a battery cell.

In step 103, a second set of pending parameters of the predetermined near-steady-state battery model are predicted according to the first set of pending parameters.

In a specific implementation, it is possible to predict the second set of pending parameters of the predetermined near-steady-state battery model based on a preset correspondence between the first set of pending parameters and the second set of pending parameters for a certain length of voltage data and the first set of pending parameters.

Exemplarily, for a determined near-steady-state battery model (such as M1), it is possible to predict the second set of pending parameters of the M1 by looking up a preset correspondence between the first set of pending parameters and the second set of pending parameters for the second preset length based on the first set of pending parameters of the M1.

In step 104, an estimated steady-state OCV value is calculated according to the second set of pending parameters, and a SOC correction value corresponding to the estimated steady-state OCV value is determined by using a preset correspondence between steady-state OCVs and SOCs to correct a current SOC.

In a specific implementation, determining a steady-state time period threshold Tt corresponding to the state data of the battery cell, and then processing the steady-state time period threshold Tt by using the near-steady-state battery model determined according to the second set of pending parameters, that is, applying the steady-state time period threshold Tt to the near-steady-state battery model determined according to the second set of pending parameters, finally, the estimated steady-state OCV value may be determined.

The steady-state time period threshold Tt may be determined by looking up a preset correspondence between SOHs, temperatures and standing time period thresholds based on SOH and temperature of the battery cell at current time.

Figure 4:
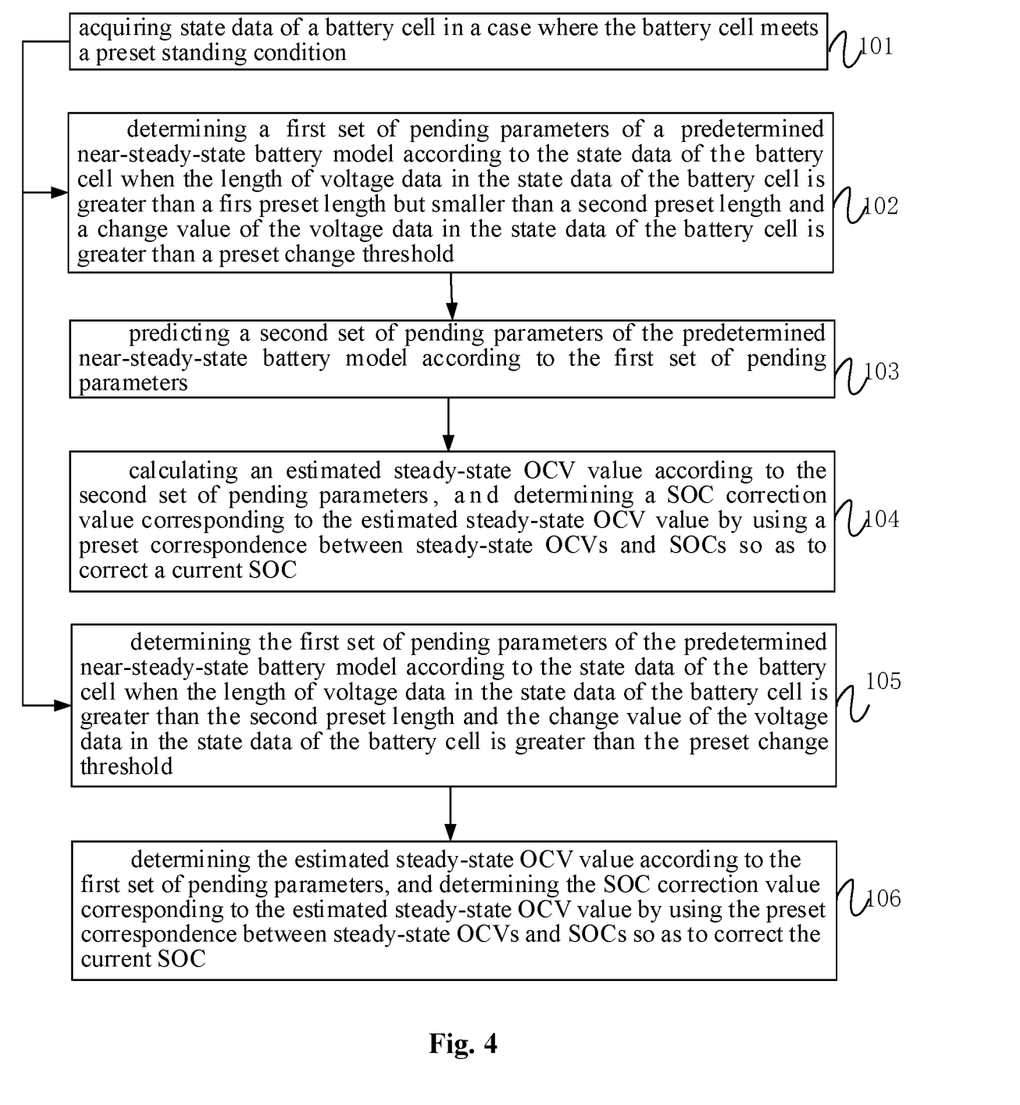
FIG. 4 is a schematic flowchart diagram of a method for correcting SOC according to a second embodiment of the disclosure.

Regarding the third length interval, steps 105-106 may be performed, see FIG. 4.

In step 105, when the length of voltage data in the state data of the battery cell is greater than the second preset length, and a change value of the voltage data in the state data of the battery cell is greater than a preset change threshold, a first set of pending parameters of a predetermined near-steady-state battery model is determined according to the state data of a battery cell.

In step 106, an estimated steady-state OCV value is determined according to the first set of pending parameters, and a SOC correction value corresponding to the estimated steady-state OCV value is determined by using the preset correspondence between steady-state OCVs and SOCs to correct the current SOC.

For the above discussed steps 101-106, in order to avoid a problem that acquisition of a steady-state OCV requires a battery cell to be let stand still for a long time during SOC estimation, the embodiments of the disclosure firstly determines pending parameters of a near-steady-state battery model according to state data of a battery cell in a case where the battery cell meets a preset standing condition to characterize variation trend of OVC over time in a near-steady state, then use the pending parameters to process a steady-state time period threshold to obtain an estimated steady-state OCV value, and then use a preset correspondence between steady-state OCVs and SOCs to determine a SOC correspond to the estimated steady-state OCV to correct a current SOC.

Compared with the conventional open circuit voltage method, it is possible for the embodiments of the present invention to determine a first set of pending parameters of a near-steady-state battery model for characterizing a change in an open circuit voltage over time in a near-steady state and use the first set of pending parameters to estimate a steady-state OCV, reducing time required to obtain a steady-state OCV and in turn increasing a chance of correction of SOC so that applicability of an open circuit voltage method can be improved.

In addition, in the embodiments of the present invention, the condition of the state data of the battery cell used in determination of the near-steady-state battery model is further limited from the viewpoint of whether the voltage data amount is sufficient and whether the change value of the voltage data is credible.

For example, in order to solve a problem that the length of the voltage data is insufficient due to within the second length interval, it is possible for the embodiments of the present invention to predict a second set of pending parameters of the predetermined near-steady-state battery model for the second preset length according to the first set of pending parameters, and then use the first set of pending parameters to estimate the steady-state OCV, thereby avoiding inaccuracy of the pending parameters of the preset near-steady-state battery model due to insufficient state data of the battery cell, and further improving estimation accuracy and applicability of the open circuit voltage method.

In an optional embodiment, it is possible to determine whether the estimated steady-state OCV value exceeds a preset OCV estimation range; when the estimated steady-state OCV value does not exceed a preset estimated OCV range, the SOC correction value corresponding to the estimated steady-state OCV value is determined by using the preset correspondence between steady-state OCVs and SOCs to correct the current SOC. Otherwise, it indicates that the estimated steady-state OCV value deviates too much or is not within the normal operation range. In this case, the SOC may be corrected by using an unsteady-state OCV method or may not be corrected.

Determination of a first set of pending parameters of the near-steady-state battery model will be described below.

In an example, at least a part of parameters in the first set of pending parameters may be determined based on a preset correspondence between SOHs, voltages, currents, temperatures and the part of parameters and SOH, voltage, current as well as temperature at current time, that is, by looking up the preset correspondence between SOHs, voltages, currents, temperatures and the part of parameters.

In an example, at least a part of parameters in the first set of pending parameters may be determined by fitting of voltage data until current time. It should be understood that the "at least a part of parameters" herein includes a part of the parameters or all of the parameters.

In an example, at least a part of parameters in the first set of pending parameters may be determined based on a preset correspondence between SOHs, voltages, currents, temperatures and the part of parameters and SOH, voltage, current as well as temperature at current time, and remaining pending parameters may be determined by fitting of a voltage sequence UList=[V1, V2, . . . Vn] from start time of the preset standing condition to current time. Fitting algorithm may include, but is not limited to, a least square method and variations thereof, a genetic algorithm or other parameter fitting methods, and the like.

For example, for the near-steady-state battery model 3 discussed above, the model parameter c3 may be determined by looking up an offline predetermined correspondence between model parameters c3 and SOHs, voltages, currents as well as temperatures based on SOH, voltage, current, and temperature of the battery cell at current time, and a recursive least square method is used to perform fitting on UList=[V1, V2, . . . Vn] to obtain the pending parameters a3 and b3.

The determination of the preset near-steady-state battery model in step 102 will be described below.

In an example, based on the voltage data of the battery cell, person skilled in the art may empirically select an appropriate near-steady-state battery model as the preset near-steady-state battery model.

In an example, based on the voltage data of the battery cell, a person skilled in the art may empirically select a suitable plurality of near-steady-state battery models and use a sum of the plurality of near-steady-state battery models as the preset near-steady-state battery model;

In an example, it is possible for a person skilled in the art to perform a fitting process according to the voltage data in the state data of the battery cell to obtain m sub-near-steady-state battery models, m fitted curves and corresponding fitted difference values, then sort the m sub-near-steady-state battery models according to the fitted difference values, and set a sum of the first n sub-near-steady-state battery models with minimal fitted difference values as the preset near-steady-state battery model, where $m \geq n \geq 1$.

In this example, the smaller the fitted difference value is, the more the sub-steady-state battery model matches actual operation data, that is, the more accurate the sub-steady-state battery model is, and the higher the accuracy of the estimated SOC is. Here, the fitting may use a variance, a standard deviation, a accumulated sum of absolute error values, a sum of errors, a maximum absolute error value, and the like, which are not limited herein.

It should be noted that a person skilled in the art can select an appropriate method to determine model pending parameters according to requirements, which is not limited herein. In addition, determination of the pending parameters of the near-steady-state battery model in the embodiments of the disclosure may be performed in real time, that is, the pending parameters of the near-steady-state battery model may be updated continuously or every a certain time interval as the standing time period of the battery cell is extended.

Figure 5:
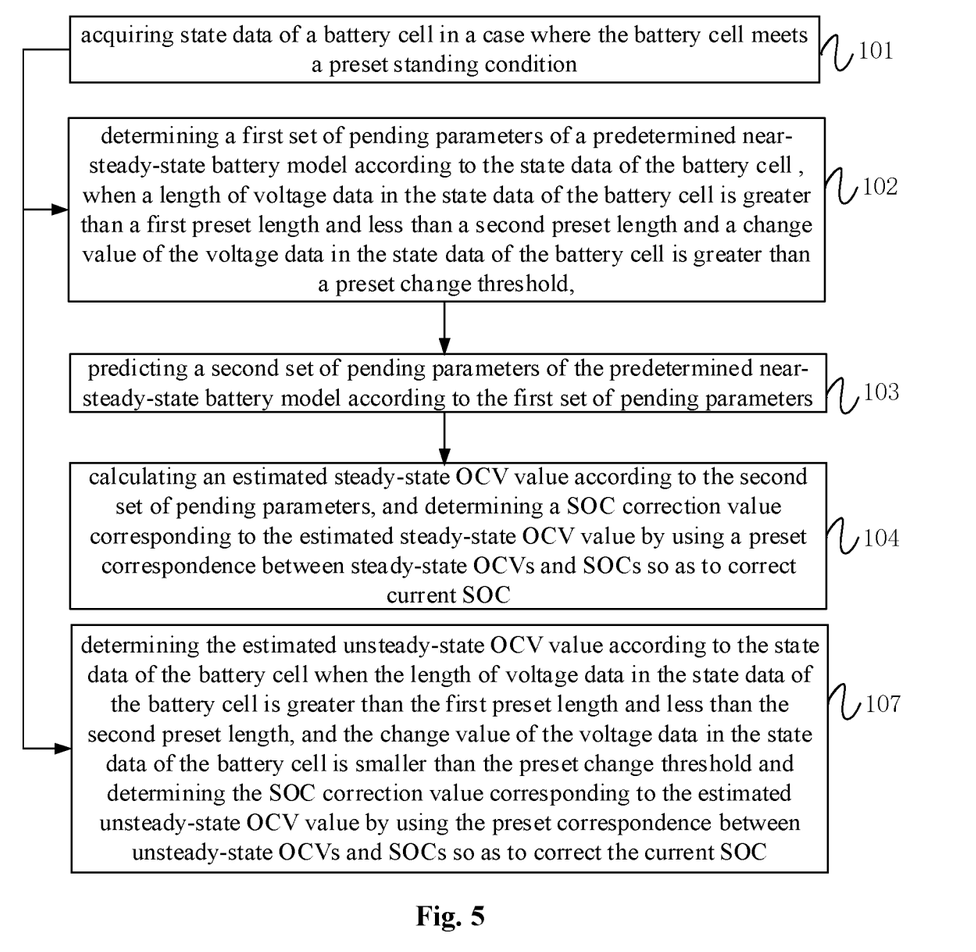
FIG. 5 is a schematic flowchart diagram of a method for correcting SOC according to a third embodiment of the disclosure.

The embodiments of the disclosure may further perform step 107 for the second length interval, as shown in FIG. 5, in consideration of the problem that accuracy of the SOC calculated based on the preset near-steady-state battery model is low since the change value of the voltage data is unreliable. For the third length interval, step 108 may also be performed, see FIG. 6.

In step 107, when the length of voltage data in the state data of the battery cell is greater than the first preset length and less than the second preset length and the change value of the voltage data in the state data of the battery cell is smaller than the preset change threshold, an estimated unsteady-state OCV value is determined according to the state data of the battery cell. A SOC correction value corresponding to the estimated unsteady-state OCV value is determined by using a preset correspondence between unsteady-state OCVs and SOCs to correct the current SOC.

Figure 6:
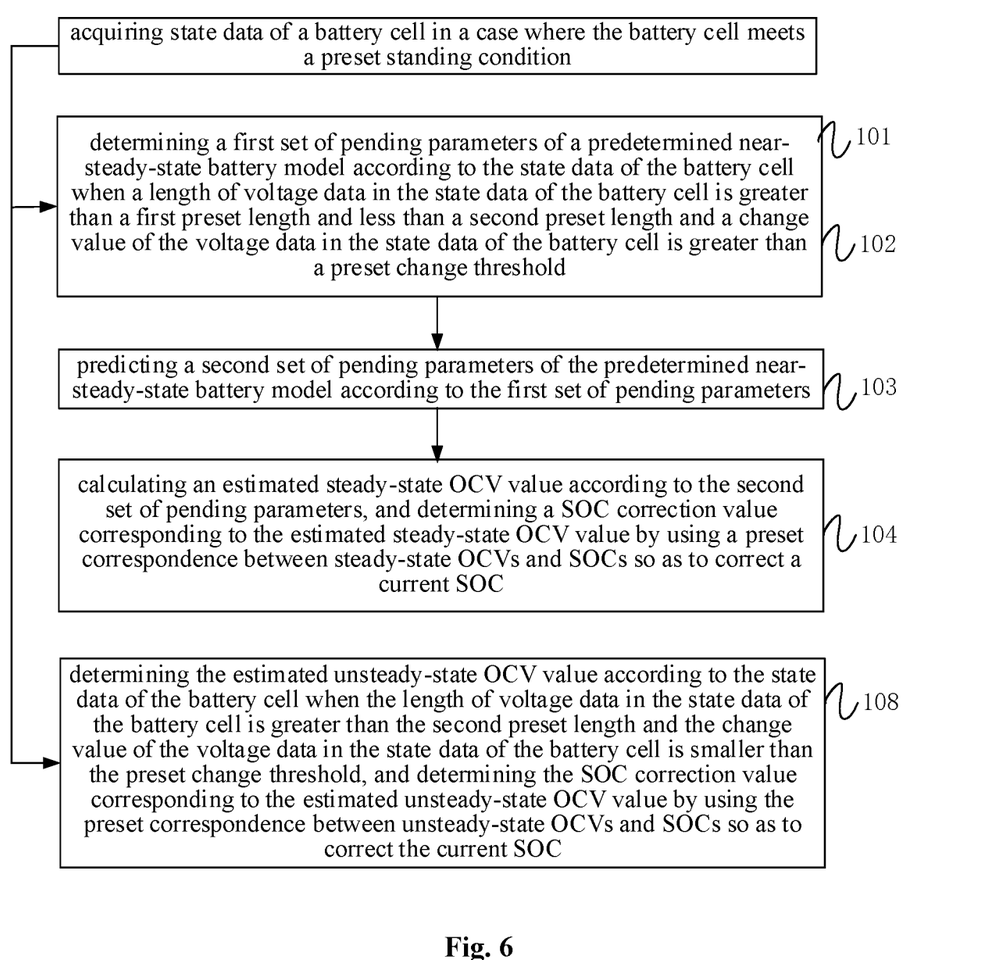
FIG. 6 is a schematic flowchart diagram of a method for correcting SOC according to a fourth embodiment of the disclosure.

In step 108, when the length of voltage data in the state data of the battery cell is greater than the second preset length and the change value of the voltage data in the state data of the battery cell is smaller than the preset change threshold, an estimated unsteady-state OCV value is determined according to the state data of the battery cell. A SOC correction value corresponding to the estimated unsteady-state OCV value is determined by using a preset correspondence between unsteady-state OCVs and SOCs to correct the current SOC.

In an example, the estimated unsteady-state OCV may be a difference between the voltage at an ending moment of the standing time period of the battery cell and a polarization voltage compensation value.

In an example, the voltage of the battery cell at the ending moment of current standing time period and the polarization voltage compensation value at the moment may be determined by looking up a predetermined correspondence between polarization voltage compensation values and currents as well as temperatures based on current and temperature of the battery cell at the ending moment of current standing time period.

In an example, the polarization voltage compensation value may be determined by looking up a predetermined correspondence between polarization voltage compensation values and statistical characteristics based on statistical characteristic (such as root-mean-square value) of voltage and temperature of the battery cell during the current standing time period.

That is to say, as compared with conventional open circuit voltage method, it is possible for the embodiments of the disclosure to employ estimation of the unsteady OCV in order to avoid the problem that accuracy of the SOC calculated based on the preset near-steady-state battery model is low since the change value of the voltage data is unreliable, thereby increasing a chance of correction of SOC so that applicability of an open circuit voltage method can be improved.

Further, rather than direct correction with the steady-state OCV, the following correction strategy may be employed before the current SOC is corrected by using the SOC corresponding to the unsteady OCV in order to avoid overcorrection of the SOC:

a voltage rebound direction of the battery cell during the current standing time period is determined, wherein the voltage rebound direction indicates a change direction of the voltage of the battery cell when the current is decreased;

when the voltage rebound direction indicates a voltage increase, that is, when the curve of voltages during the standing time period over time is monotonically increasing, indicating that the SOC corresponding to the unsteady-state OCV is a lower limit of a trustable SOC, it is determined whether the SOC corresponding to the unsteady-state OCV is greater than the current SOC, and then the SOC corresponding to the unsteady-state OCV is used to correct the current SOC; and when the voltage rebound direction indicates a voltage decrease, that is, when the curve of voltages during the standing time period over time is monotonically decreasing, indicating that the SOC corresponding to the unsteady-state OCV is a upper limit of a trustable SOC, it is determined whether the SOC corresponding to the unsteady-state OCV is smaller than the current SOC, and then the SOC corresponding to the unsteady-state OCV is used to correct the current SOC.

Further, rather than direct correction with the steady-state OCV, the following correction strategy may be employed before the current SOC is corrected by using the SOC corresponding to the unsteady OCV in order to save computational resources:

a difference between the SOC corresponding to the unsteady-state OCV and the current SOC is calculated; and when an absolute value of the difference is greater than a preset difference threshold, the current SOC corrected by using the SOC corresponding to the unsteady-state OCV Further, in order to avoid overcorrection, an average of the SOC corresponding to the unsteady-state OCV and the current SOC may be calculated and the current SOC may be corrected by using the average.

Figure 7:
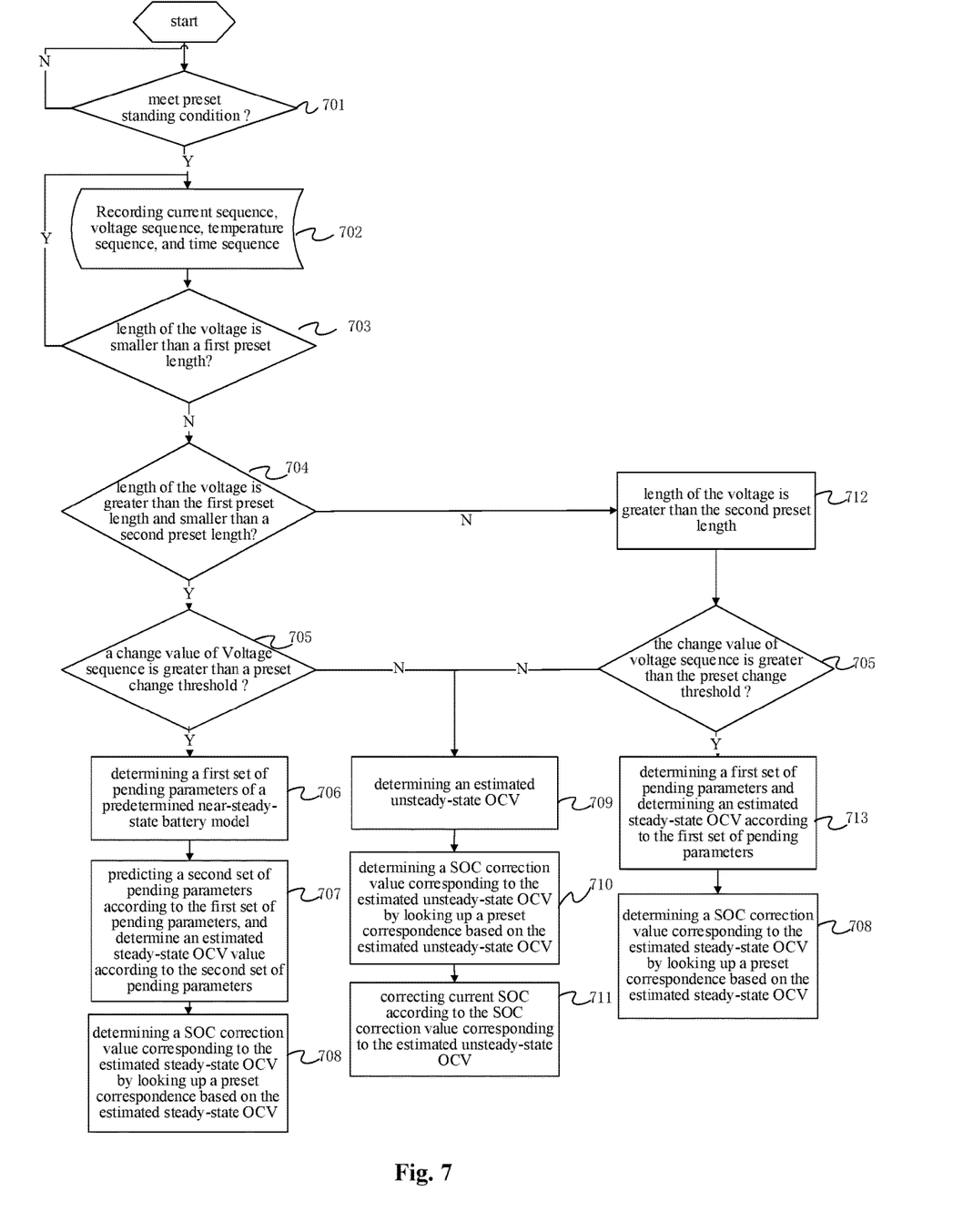
FIG. 7 is a schematic flowchart diagram of a method for correcting SOC according to a fifth embodiment of the disclosure.

FIG. 7 is a schematic flowchart diagram of a method for correcting SOC according to another embodiment of the disclosure.

The method for correcting SOC shown in FIG. 7 includes steps 701 to 713 for illustrating the method for correcting SOC of the embodiments of the disclosure.

In step 701, it is determined whether the battery cell meets a preset standing condition, and if so, the method proceeds to step 702, otherwise the method goes back to step 701.

In step 702, in the case where the battery cell meets a preset standing condition, a voltage sequence, a current sequence, a temperature sequence of the battery cell and a time sequence are recorded.

In step 703, it is determined whether the length of the voltage sequence is smaller than the first preset length. If the length of the voltage sequence is smaller than a first preset length, the method goes back to the step 702. Otherwise, the method proceeds to the step 704.

In step 704, it is determined whether the length of the voltage sequence is greater than the first preset length but less than a second preset length. If the length of the voltage sequence is greater than the first preset length but less than a second preset length, the method proceeds to the step 705. Otherwise, the method proceeds to the step 712.

In step 705, it is determined whether a change value of the voltage data in the state data of the battery cell is greater than a preset change threshold. If the change value of the voltage data in the state data of the battery cell is greater than a preset change threshold, the method proceeds to the step 706. Otherwise, the method proceeds to the step 709.

In step 706, a first set of pending parameters of a predetermined near-steady-state battery model is determined.

In step 707, a second set of pending parameters of the predetermined near-steady-state battery model is predicted according to the first set of pending parameters, and an estimated steady-state OCV value is determined according to the second set of pending parameters.

In step 708, a SOC corresponding to the estimated steady-state OCV value is determined by looking up a preset correspondence between steady-state OCVs and SOCs based on the estimated steady-state OCV value to correct the current SOC.

In step 709, an unsteady-state OCV value is estimated.

In step 710, a SOC corresponding to the estimated unsteady-state OCV value is determined by looking up a preset correspondence between unsteady-state OCVs and SOCs based on the estimated unsteady-state OCV value.

In step 711, the current SOC is corrected by using the SOC corresponding to the estimated unsteady-state OCV value.

In step 712, it is determined whether the length of the voltage sequence is greater than the second preset length. If the length of the voltage sequence is greater than the second preset length, the method proceeds to the step 705 and then to the step 713. Otherwise, the method proceeds to the step 709.

In step 713, the first set of pending parameters of the near-steady-state battery model are determined and the steady-state OCV is estimated according to the first set of pending parameters, and then the step 708 is performed.

Figure 8:
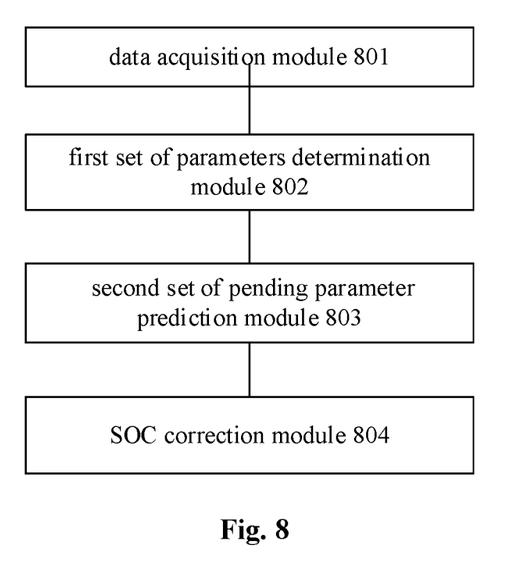
FIG. 8 is a schematic structural diagram of an apparatus for correcting SOC according to an embodiment of the disclosure.

FIG. 8 is a schematic structural diagram of an apparatus for correcting SOC according to an embodiment of the disclosure. As shown in FIG. 8, the apparatus includes: a data acquisition module 801, a first set of parameters determination module 802, a second set of pending parameter prediction module 803, and a SOC correction module 804.

The data acquisition module 801 is configured to acquire state data of a battery cell in a case where the battery cell meets a preset standing condition.

The first set of parameters determination module 802 is configured to determine, when a length of voltage data in the state data of the battery cell is greater than a first preset length and less than a second preset length, and a change value of the voltage data in the state data of the battery cell is greater than a preset change threshold, a first set of pending parameters of a predetermined near-steady-state battery model according to the state data of the battery cell.

The second set of pending parameter prediction module 803 is configured to predict a second set of pending parameters of the predetermined near-steady-state battery model according to the first set of pending parameters.

The SOC correction module 804 is configured to calculate an estimated steady-state OCV value according to the second set of pending parameters, and determine a SOC correction value corresponding to the estimated steady-state OCV value by using a preset correspondence between steady-state OCVs and SOCs to correct a current SOC.

The embodiments of the disclosure also provide a battery management system including the apparatus for correcting SOC as described above.

The embodiments of the disclosure also provide a storage medium having a program stored thereon, wherein the program is executed by the processor to perform the method for correcting SOC as described above.

It is to be understood that the various embodiments in the disclosure are described in a progressive manner, and the same or similar parts between the various embodiments may be referred to each other, and each embodiment focuses on differences from other embodiments. For the apparatus embodiment, relevant aspects can be found in the description section of the method embodiment. The embodiments of the disclosure are not limited to the specific steps and structures described above and illustrated in the drawings. A person skilled in the art can make various changes, modifications and additions, or change the order between the steps under the spirit of the embodiments of the disclosure. Also, a detailed description of known method techniques is omitted herein for the sake of brevity.

The functional blocks shown in the block diagrams described above may be implemented as hardware, software, firmware, or a combination thereof. When implemented in hardware, it can be, for example, an electronic circuit, an application specific integrated circuit (ASIC), suitable firmware, plug-ins, function cards, and the like. When implemented in software, the elements of the embodiments of the disclosure may be programs or code segments that can be used to perform required tasks. The program or code segments may be stored in a machine readable medium or transmitted over a transmission medium or communication link through a data signal carried in the carrier. A "machine-readable medium" may include any medium that can store or transfer information. Examples of machine-readable media include electronic circuits, semiconductor memory devices, ROM, flash memory, erasable ROM (EROM), floppy disks, CD-ROMs, optical disks, hard disks, fiber optic media, radio frequency (RF) links, and the like. The code segments may be downloaded via a computer network such as the Internet, an intranet, and the like.

The embodiments of the disclosure may be embodied in other specific forms without departing from the spirit and essential characteristics thereof. For example, the algorithms described in the specific embodiments may be modified, while the system architecture does not depart from the basic spirit of the embodiments of the disclosure. The present embodiments are to be considered in all respects as illustrative and not limiting, and the scope of the embodiments of the disclosure is determined by the appended claims rather than the descriptions. All changes within scope of the claims and equivalents thereof are thus included in the scope of the embodiments of the disclosure.

What is claimed is:

1. A method for correcting a State of Charge (SOC), comprising:
   acquiring state data of a battery cell in a case where the battery cell meets a preset standing condition, wherein the state data of the battery cell comprises: current and voltage data, the preset standing condition is that the current in the state data of the battery cell is less than a preset current threshold, wherein a length of the voltage data in the state data of the battery cell is greater than a preset length;
   calculating an estimated steady-state Open Circuit Voltage (OCV) value according to the state data of the battery cell, under a condition that a change value of the voltage data in the state data of the battery cell is greater than a preset change threshold;
   determining a SOC correction value corresponding to the estimated steady-state OCV value; and
   correcting a current SOC by using the SOC correction value corresponding to the estimated steady-state OCV value.

2. The method according to claim 1, wherein the state data of the battery cell further comprises: State of Health (SOH) and temperature;
   wherein the calculating the estimated steady-state OCV value according to the state data of the battery cell comprises:
   determining a steady-state time period threshold corresponding to the SOH and the temperature in the state data of the battery cell; and
   calculating the estimated steady-state OCV value according to the voltage data in the state data of the battery cell and the steady-state time period threshold.

3. The method according to claim 1, wherein the determining the SOC correction value corresponding to the estimated steady-state OCV value to correct the current SOC comprises:
  determining whether the estimated steady-state OCV value exceeds a preset estimated OCV range; and
  determining, when the estimated steady-state OCV value does not exceed the preset estimated OCV range, the SOC correction value corresponding to the estimated steady-state OCV value to correct the current SOC.

4. The method according to claim 1, further comprising:
  determining an estimated unsteady-state OCV value according to the state data of the battery cell, under a condition that the change value of the voltage data in the state data of the battery cell is smaller than the preset change threshold;
  determining a SOC correction value corresponding to the estimated unsteady-state OCV value; and
  correcting the current SOC by using the SOC correction value corresponding to the estimated unsteady-state OCV value.

5. The method according to claim 4, further comprising:
  determining a voltage rebound direction during a standing time period of the battery cell;
  wherein the correcting the current SOC by using the SOC correction value corresponding to the estimated unsteady-state OCV value, comprises:
  correcting the current SOC by using the SOC correction value corresponding to the estimated unsteady-state OCV value under a condition that the voltage rebound direction indicates a voltage increase and the SOC correction value corresponding to the estimated unsteady-state OCV is greater than the current SOC.

6. The method according to claim 5, wherein the correcting the current SOC by using the SOC correction value corresponding to the estimated unsteady-state OCV value, comprises:
  correcting the current SOC by using the SOC correction value corresponding to the estimated unsteady-state OCV value under a condition that the voltage rebound direction indicates a voltage decrease and the SOC correction value corresponding to the estimated unsteady-state OCV is smaller than the current SOC.

7. The method according to claim 2, wherein the calculating the estimated steady-state OCV value according to the voltage data in the state data of the battery cell and the steady-state time period threshold comprises:
  determining a change of a near-steady-state OCV over time according to the voltage data of the battery cell; and
  calculating the estimated steady-state OCV value according to the change of the near-steady-state OCV over time and the steady-state time period threshold.

8. The method according to claim 2, wherein the preset current threshold is determined based on the SOC and the temperature.

9. The method according to claim 1, wherein the preset length is determined according to the current in the state data of the battery cell.

10. A battery management system, comprising a processor and a memory storage;
  the memory storage, configured to store a program thereon; and
  the processor, configured to:
    acquire state data of a battery cell in a case where the battery cell meets a preset standing condition, wherein the state data of the battery cell comprises: current and voltage data, the preset standing condition is that the current in the state data of the battery cell is less than a preset current threshold, wherein a length of the voltage data in the state data of the battery cell is greater than a preset length;
    calculate an estimated steady-state Open Circuit Voltage (OCV) value according to the state data of the battery cell, under a condition that a change value of the voltage data in the state data of the battery cell is greater than a preset change threshold;
    determine a SOC correction value corresponding to the estimated steady-state OCV value; and
    correct a current SOC by using the SOC correction value corresponding to the estimated steady-state OCV value.

11. The battery management system according to claim 9, wherein the state data of the battery cell further comprises: State of Health (SOH) and temperature; and
  the processor is further configured to:
    determine a steady-state time period threshold corresponding to the SOH and the temperature in the state data of the battery cell; and
    calculate the estimated steady-state OCV value according to the voltage data in the state data of the battery cell and the steady-state time period threshold.

12. The battery management system according to claim 9, wherein the processor is further configured to:
  determine whether the estimated steady-state OCV value exceeds a preset estimated OCV range; and
  determine, when the estimated steady-state OCV value does not exceed the preset estimated OCV range, the SOC correction value corresponding to the estimated steady-state OCV value to correct the current SOC.

13. The battery management system according to claim 9, wherein the processor is further configured to:
  determine an estimated unsteady-state OCV value according to the state data of the battery cell, under a condition that the change value of the voltage data in the state data of the battery cell is smaller than the preset change threshold;
  determine a SOC correction value corresponding to the estimated unsteady-state OCV value; and
  correct the current SOC by using the SOC correction value corresponding to the estimated unsteady-state OCV value.

14. The battery management system according to claim 13, wherein the processor is further configured to:
  determine a voltage rebound direction during a standing time period of the battery cell;
  correct the current SOC by using the SOC correction value corresponding to the estimated unsteady-state OCV value under a condition that the voltage rebound direction indicates a voltage increase and the SOC correction value corresponding to the estimated unsteady-state OCV is greater than the current SOC.

15. The battery management system according to claim 14, wherein the processor is further configured to:
  correct the current SOC by using the SOC correction value corresponding to the estimated unsteady-state OCV value under a condition that the voltage rebound direction indicates a voltage decrease and the SOC correction value corresponding to the estimated unsteady-state OCV is smaller than the current SOC.

16. The battery management system according to claim 10, wherein the processor is further configured to:
  determine a change of a near-steady-state OCV over time according to the voltage data of the battery cell; and calculate the estimated steady-state OCV value according to the change of the near-steady-state OCV over time and the steady-state time period threshold.

17. The battery management system according to claim 10, wherein the preset current threshold is determined based on the SOC and the temperature.

18. The battery management system according to claim 9, wherein the preset length is determined according to the current in the state data of the battery cell.

\* \* \* \* \*